(12) United States Patent
Yoshida et al.

(10) Patent No.: US 6,356,430 B1
(45) Date of Patent: Mar. 12, 2002

(54) CERAMIC ELECTRONIC PART

(75) Inventors: Kazuhiro Yoshida; Mitsuru Nagashima, both of Shimane-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/451,010

(22) Filed: Nov. 29, 1999

(30) Foreign Application Priority Data

Dec. 3, 1998 (JP) .............................. 10-344564

(51) Int. Cl.[7] .......................... H01G 4/008; H01G 4/06
(52) U.S. Cl. .................. 361/305; 361/321.2; 361/303
(58) Field of Search ................. 361/306.1, 308.1, 361/309, 303, 310, 305, 311–313, 321.2, 321.5

(56) References Cited

U.S. PATENT DOCUMENTS 4,604,676 A * 8/1986 Senda et al. ............... 361/309
6,043,973 A * 3/2000 Nagashima et al. ........ 361/305

FOREIGN PATENT DOCUMENTS

GB 2106714 * 4/1983

OTHER PUBLICATIONS

Patent Abstracts of Japan, vol. 016, No. 367 (E–1245), Aug. 7, 1992, & JP 04 116910 A (Dai Ichi Kogyo Seiyaku Co Ltd. Others: 02), Apr. 17, 1992; Abstract.

* cited by examiner

*Primary Examiner*—Anthony Dinkins
(74) *Attorney, Agent, or Firm*—Ostrolenk, Faber, Gerb & Soffen, LLP

(57) ABSTRACT

A ceramic electronic part includes a terminal electrode which less causes deterioration in electric characteristics due to diffusion of Sn contained in solder. In a monolithic ceramic electronic part of the present invention, terminal electrodes are formed on the outer surface of a ceramic sintered compact as a ceramic element assembly, and first electrode layers of the terminal electrodes, which closely adhere to the surface of the ceramic sintered compact, contain a main component metal, which constitutes the terminal electrodes, and a metal having higher affinity for oxygen than Sn.

17 Claims, 4 Drawing Sheets

CERAMIC ELECTRONIC PART

BACKGROUND OF THE INVENTION

1. Field of the Invention

The present invention relates to a ceramic electronic part such as, for example, a monolithic capacitor, a ceramic inductor, or the like, and particularly to a ceramic electronic part in which the structure of terminal electrodes formed on the outer surface of a ceramic element assembly is improved.

2. Description of the Related Art

Conventional methods of forming terminal electrodes of ceramic electronic parts include coating and baking of conductive paste, wet plating, thin film deposition such as vapor deposition, sputtering, and the like. In order to enable surface mounting of ceramic electronic parts on a printed circuit board, a metal layer having excellent solderability is frequently formed on the outermost surface of a terminal electrode.

FIG. 7 shows a monolithic capacitor 51 as an example of a conventional ceramic electronic part. Monolithic capacitor 51 comprises a ceramic sintered compact 52 made of a dielectric ceramic material. The ceramic sintered compact 52 contains internal electrodes 53a to 53f which are arranged to overlap each other with ceramic layers held therebetween. The internal electrodes 53a, 53c and 53e extend to an end surface 52a of the ceramic sintered compact 52 and the internal electrodes 53b, 53d and 53f extend to an end surface 52b. Terminal electrodes 54 and 55 are formed to cover the end surfaces 52a and 52b, respectively.

Each of the terminal electrodes 54 and 55 includes a first electrode layer 54a or 55a, a second electrode layer 54b or 55b, and a third electrode layer 54c or 55c which are laminated together. The first electrode layers 54a and 55a are formed by coating and baking a conductive paste which is mainly composed of a metal powder of Ag, Pd, Ag—Pd, Cu, or the like, and are electrically connected to the internal electrodes 53a, 53c, and 53e or the internal electrodes 53b, 53d and 53f with excellent reliability. The third electrode layers 54c and 55c are formed by plating Sn or a Sn alloy, for improving solderability. The intermediate second electrode layers 54b and 55b are respectively provided for preventing diffusion of Ag from the first electrode layers 54a and 55a into solder during soldering, and preventing diffusion of Sn, contained in the third electrode layers 54c and 55c and the solder used in soldering, into the first electrode layers 54a and 55a and the ceramic sintered compact 52, or at least decreasing the diffusion rate. Diffusion of Sn to the interfaces between the terminal electrodes 54 and 55 and the ceramic sintered compact 52 deteriorates the adhesion of the terminal electrodes 54 and 55 to the sintered compact 52, thereby failing to obtain desired electric characteristics.

This is due to the fact that the adhesion between the terminal electrodes 54 and 55 and the ceramic sintered compact 52 depends upon oxygen bonding between the metal which forms the terminal electrodes 54 and 55, and the ceramic material, and the oxygen bonding between the electrode forming metal and the ceramic material is broken in the presence of Sn, resulting in a deterioration of the adhesion.

Therefore, the monolithic capacitor 51 includes the second electrode layers 54b and 55b to prevent the diffusion of Sn or to at least decrease the diffusion rate. Each of the second electrode layers 54b and 55b comprises a deposited film of a metal such as Ni, Ti, Cr or Mo, or an alloy thereof.

The above-described terminal electrodes having the three-layer structure are used in not only monolithic capacitors, but also various other ceramic electronic parts such as a monolithic varistor, a monolithic piezoelectric part, and the like; a single-chip ceramic capacitor, a ceramic thermistor, and the like, which are not monolithic.

While, the electrode layers 54b and 55b (comprising a deposited film of a metal such as Ti, Ni, Cr or Mo, or an alloy mainly composed of any of these metals) prevent (or slow down) the diffusion of Sn to the first electrode layers 54a and 55a, respectively, in some cases, the plating solution used to deposit the metal film enters the ceramic sintered compact 52. Therefore, the interfaces between the ceramic material, which forms the ceramic sintered compact 52 and the internal electrodes 53a–53f are reduced resulting in defects such as layer separation, cracks, etc., and failure to obtain desired electric characteristics such as electrostatic capacity. Particularly, in the formation of a single film of a metal having high affinity for oxygen, such as Ti, Cr, Mo, or the like, in a ceramic electronic part used at a relatively high voltage, i.e., in a medium-to-high-voltage region, there is oxygen depletion in the ceramic material located at the end surface 52a of the ceramic sintered compact, significantly deteriorating electric characteristics and conductivity with reduction of ceramic. The effectiveness of Ni in preventing diffusion of Sn to the first electrode layers 54a and 55a insufficient, compared to Ti, Cr, and Mo.

SUMMARY OF THE INVENTION

Accordingly, an object of the present invention is to solve the defects of the above-described conventional technology, and provide a ceramic electronic part comprising terminal electrodes capable of suppressing diffusion of Sn contained in solder into a ceramic element assembly, and causing less reduction of ceramic, thereby securely exhibiting desired electric characteristics.

The present invention provides a ceramic electronic part comprising a ceramic element assembly, and terminal electrodes formed on the outer surface of the ceramic element assembly, wherein the portions of the terminal electrodes, which adhere to the surface of the ceramic element assembly contain both a main component element which forms the primary component of said portions of the terminal electrodes, and a metal having higher affinity for oxygen than Sn.

In the terminal electrodes of the ceramic electronic part of the present invention, the metal having higher affinity for oxygen than Sn may be mixed in the terminal electrodes, or may be alloyed with the main component metal. More generally, the metal having higher affinity for oxygen than Sn can be present in various forms in the terminal electrodes.

The terminal electrodes may comprise a single electrode layer, or a lamination of a plurality of electrode layers. In the terminal electrodes comprising a lamination of a plurality of electrode layers, a layer which adheres to the ceramic element assembly contains the metal having higher affinity for oxygen than Sn.

As the metal having higher affinity for oxygen than Sn, it is preferable to select at least one metal from the group consisting of Ti, Mo, W, and V.

The metal having higher affinity for oxygen than Sn is mixed so that it is present in the faces of the terminal electrodes which adhere to the ceramic element assembly at a ratio of 0.1 to 20% by weight of the main component metal.

BRIEF DESCRIPTION OF THE DRAWINGS

Other features and advantages of the present invention will become apparent from the following description of the invention which refers to the accompanying drawings.

DESCRIPTION OF THE PREFERRED EMBODIMENT

Figure 1:
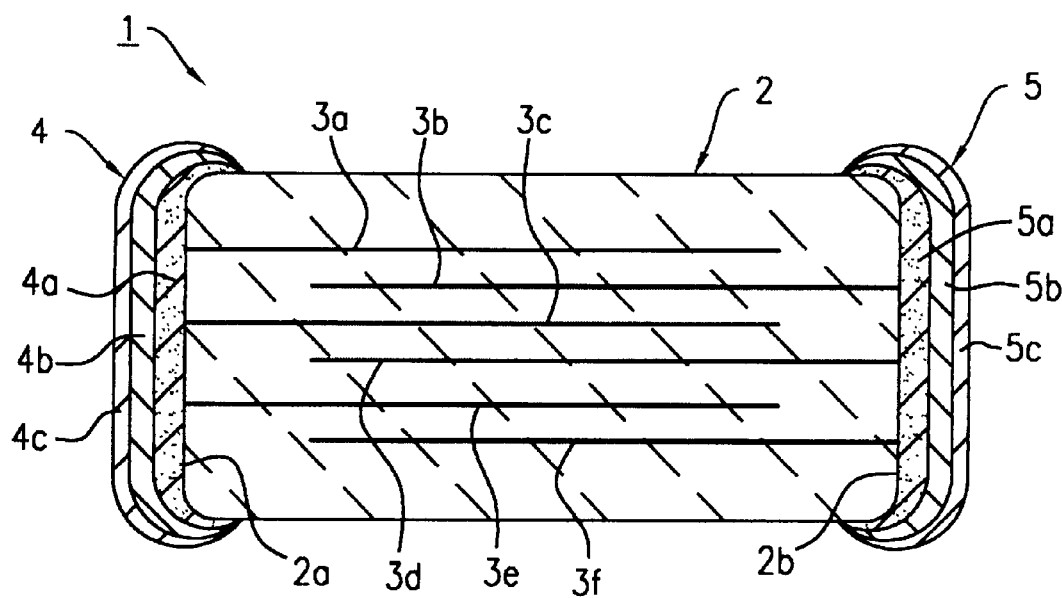
FIG. 1 is a longitudinal sectional view showing a monolithic capacitor as a ceramic electronic part in accordance with a first embodiment of the present invention.

Referring now to the drawings wherein like numerals indicate like elements, there is shown in FIG. 1 a monolithic capacitor formed in accordance with a first embodiment of the present invention. Monolithic capacitor 1 comprises a ceramic sintered compact 2 composed of dielectric ceramic such as barium titanate ceramic, or the like. The ceramic sintered compact 2 contains a plurality of internal electrodes 3a to 3f which are formed to overlap each other with ceramic layers held therebetween in the thickness direction.

The internal electrodes 3a, 3c, and 3e extend to an end surface 2a; the internal electrodes 3b, 3d, and 3f extend to the opposite end surface 2b. The internal electrodes 3a to 3f are formed using an appropriate metallic material such as Ag, Pd, an Ag—Pd alloy, Ni, Cu, or the like.

Terminal electrodes 4 and 5 are formed to cover the end surfaces 2a and 2b, respectively. Each of the terminal electrodes 4 and 5 has a structure in which a first electrode layer 4a or 5a, a second electrode layer 4b or 5b, and a third electrode layer 4c or 5c are laminated outwardly from the side near the end surface 2a or 2b of the ceramic sintered compact 2.

This embodiment is characterized in that each of the first electrode layers 4a and 5a comprises an alloy film composed primarily of a first metal having excellent conductivity (the main component metal), and a second metal having a higher affinity for oxygen than Sn. By way of example, the main component metal may be any conventionally used as an electrode material and having excellent conductivity, such as Cu, Ag, Pd, Au, or Ni, or an alloy mainly composed of any of these metals. When using Ni or an alloy mainly composed of Ni, the conductivity of the main component metal is somewhat lower than when Cu, Ag, Pd, and Au, but the same effect on diffusion of Sn can be obtained.

Examples of metals which have a higher affinity for oxygen than Sn include, Ti, Mo, W, and V.

In this embodiment, the metal having a higher affinity for oxygen than Sn is alloyed at a rate of 0.1 to 20% by weight compared to 100% by weight of the main component metal. With less than 0.1% by weight of metal having higher affinity for oxygen than Sn, the effect of the addition of the metal having higher affinity for oxygen than Sn cannot be sufficiently obtained, thereby deteriorating the adhesion of the first electrode layers 4a and 5a, and deteriorating the electric characteristics of the capacitor. With over 20% by weight of metal having higher affinity for oxygen than Sn, the conductivity of the first electrode layers 4a and 5a deteriorates, and the ceramic material is reduced. Any suitable method for forming the first electrode layers 4a and 5a may be used as long as alloy films can be formed to cover the end surfaces 2a and 2b, respectively, of the ceramic sintered compact 2. For example, the first electrode layers 4a and 5a may be formed by coating and baking conductive paste containing an alloy powder of the primary metal component and the metal having higher affinity for oxygen than Sn, or a thin film deposition method such as vapor deposition, plating or sputtering.

In this embodiment, the second electrode layers 4b and 5b formed on the first electrode layers 4a and 5a, respectively, preferably comprise Ni as a main component having excellent soldering heat resistance. The third electrode layers 4c and 5c are preferably formed by plating Sn or an Sn alloy in order to improve solderability.

In the present invention, the second and third electrode layers can be omitted.

Desired electric characteristics can be securely obtained by the terminal electrodes 4 and 5.

The adhesive force of a thin film electrode depends greatly upon oxygen bonding in the interfaces between the ceramic sintered compact 2 and the terminal electrodes 4 and 5. In a monolithic capacitor, when Sn contained in solder diffuses into the terminal electrodes and reaches the interfaces between the terminal electrodes and the ceramic sintered compact, oxygen bonding between the electrode metal and ceramic is deprived of oxygen by Sn. As a result, the bonding between the electrode metal which constitutes the electrode layers and ceramic is broken, deteriorating the force of adhesion to the ceramic sintered compact. Particularly, when the electronic part generates heat, and is used at a relatively high temperature, as in medium-to-high voltage use, the above deterioration in adhesive force occurs significantly, and desired electric characteristics cannot be obtained.

On the other hand, in this embodiment, the first electrode layers 4a and 5a contain a metal having affinity for oxygen which is higher than that of Sn. Since this metal is present in the interfaces between the first electrode layers 4a and 5a and the ceramic sintered compact 2, even when Sn contained in solder diffuses, the oxygen bonding through the metal having higher affinity for oxygen than Sn is stronger. Therefore, the diffusion of Sn does not cause significant deterioration in the adhesive strength between the first electrode layers 4a and 5a and the ceramic sintered compact 2, and there is less diffusion of Sn into the ceramic sintered compact 2. Thus, the monolithic capacitor 1 can maintain its desired electric characteristics.

Since the main component of the first electrode layers 4a and 5a is a metal having excellent conductivity, it is possible to decrease the dielectric loss and calorific value in the terminal electrodes 4 and 5. For example, in a ceramic electronic part used for medium-to-high-voltage applications, it is possible to achieve low dielectric loss and low calorific value.

Therefore, in the monolithic capacitor 1 of this embodiment, deterioration of electric characteristics due to diffusion of Sn contained in solder can be suppressed, thereby providing a monolithic capacitor 1 which is suitable for use in medium-to-high-voltage applications.

Figure 2:
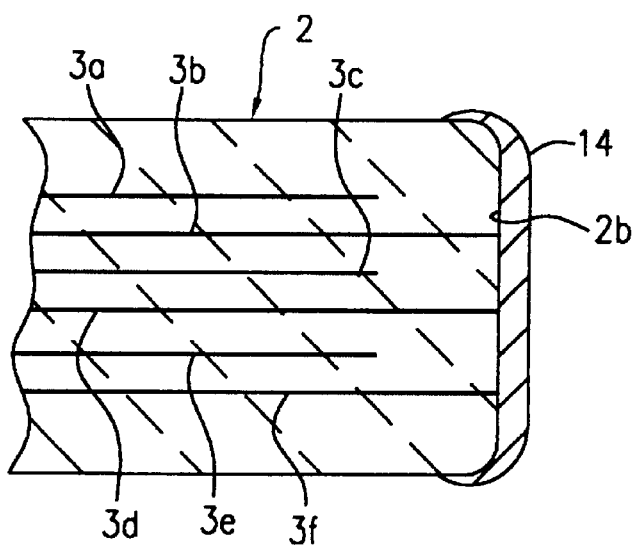
FIG. 2 is a partially cut-away sectional view illustrating the step of forming terminal electrodes in a monolithic capacitor in accordance with a second embodiment of the present invention.
Figure 3:
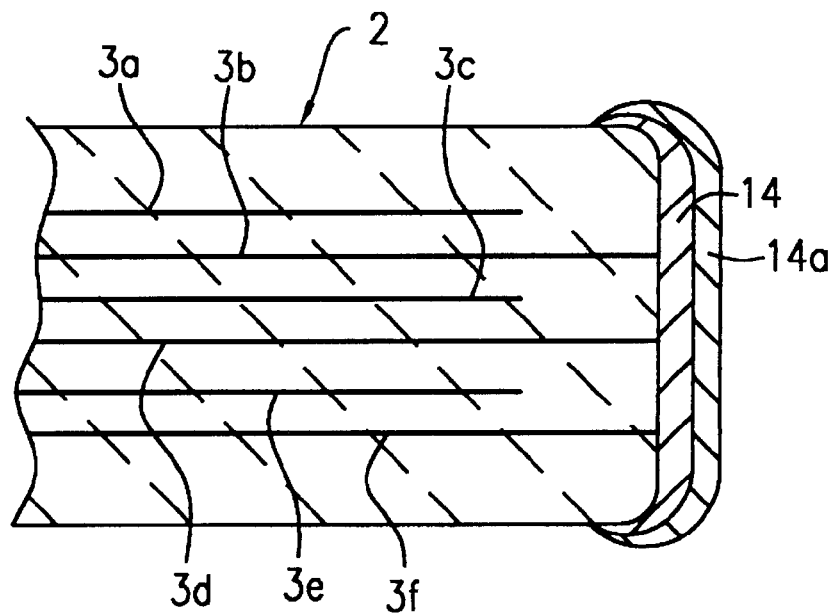
FIG. 3 is a partially cut-away sectional view showing a state where a metal film having higher affinity for oxygen than Sn is formed on a metal film in the monolithic capacitor shown in FIG. 2.
Figure 4:
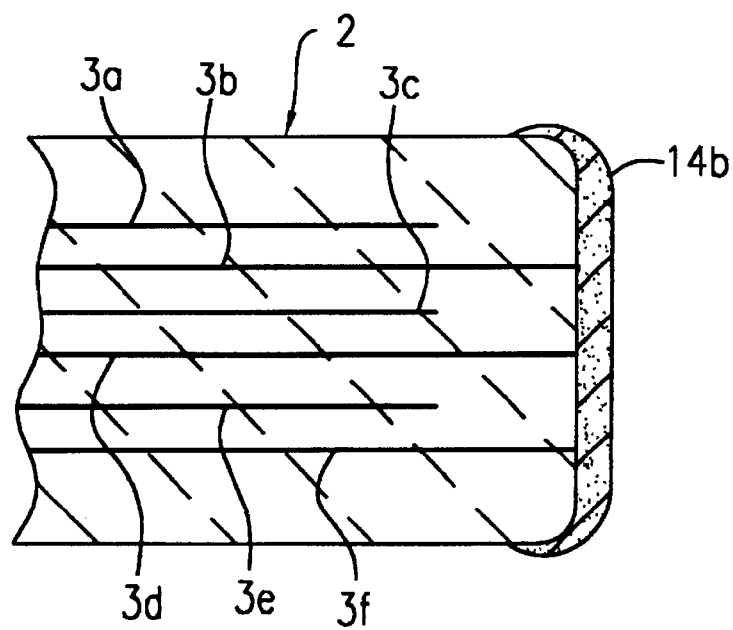
FIG. 4 is a partially cut-away sectional view illustrating a terminal electrode formed by diffusing a metal having higher affinity for oxygen than Sn into a first metal film.

With reference to FIGS. 2 to 4, description will now be made of a structure in accordance with a second embodiment of the present invention. In this embodiment, a metal having a higher affinity for oxygen than Sn is present in terminal electrodes without being alloyed.

In order to form a first electrode layer on an end surface 2b of a ceramic sintered compact 2 by a thin film deposition method such as vapor deposition, plating or sputtering, a metal film 14 having excellent conductivity is formed. Like in the first embodiment, Cu, Ag, Pd, Au or Ni, or an alloy mainly composed of any of these metals, can be used as the main component metal having excellent conductivity.

Next, as shown in FIG. 3, a metal film 14a having an affinity for oxygen which is higher than that of Sn is deposited on the metal film 14. The metal film 14a can be formed by a thin film deposition method, and is formed to a thickness smaller than the metal film 14. The metal having a higher affinity for oxygen than Sn is thermally diffused into the metal film 14 by thermal energy during deposition of the metal film 14a, or heating after the metal film 14a is formed.

As a result, as shown in FIG. 4, the metal having higher affinity for oxygen than Sn is diffused into the metal film 14 to form a first electrode layer 14b. In the first electrode layer 14b, the metal having higher affinity for oxygen than Sn is diffused in the metal film comprising a main component metal (i.e., the metal which forms the main component of the electrode layer) to form a single electrode layer in which the metal having higher affinity for oxygen than Sn is present without being alloyed. In this way, the metal having a higher affinity for oxygen than Sn is not alloyed but is diffused in the first electrode layer 14b. In this case, like the first electrode layers 4a and 5a of the first embodiment, even when Sn is diffused, the adhesive strength of the terminal electrodes, and electric characteristics, deteriorate to a lesser degree as long as the metal having higher affinity for oxygen than Sn is diffused to reach the interface between the end surface 2b of the ceramic sintered compact 2 and the first electrode layer 14b. Even when the metal having higher affinity for oxygen is alloyed in the first electrode layer 14b during diffusion, like the first electrode layers 4a and 5a of the first embodiment, the adhesive strength of the terminal electrodes, and electric characteristics, deteriorate less due to diffusion of Sn.

Any method may be used to thermally diffuse the metal having higher affinity for oxygen than Sn, and as described above, the metal film 14a may be deposited under conditions in which the metal is thermally diffused, or the metal having higher affinity for oxygen than Sn may be diffused into the metal film 14 by heating after the deposition of the metal film 14a. Of course, it is necessary to thermally diffuse the metal having higher affinity for oxygen than Sn in such a manner that the metal film 14a composed of that metal is not present as a single metal layer. Therefore, it is necessary to select the thickness of the metal film 14a and the quantity of the heat required for thermally diffusing the metal to satisfy the above condition.

A third embodiment of the present invention will be described with reference to FIGS. 5(a) and (b).

Figure 5A:
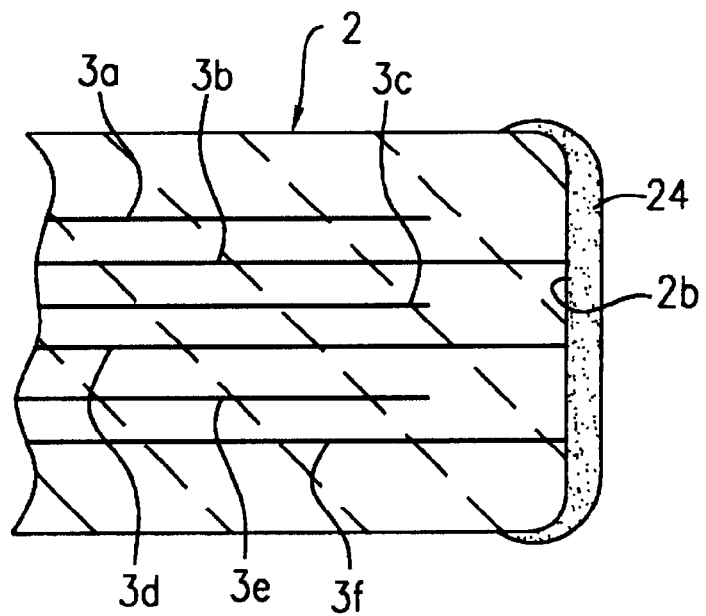
FIGS. 5(a) and (b) are partially cut-away sectional views respectively illustrating steps for forming terminal electrodes in a third embodiment.

In the third embodiment, as shown in FIG. 5(a), a conductive paste layer 24 is formed to cover an end surface 2b of a ceramic sintered compact 2. The conductive paste layer 24 is formed by coating conductive paste containing a main component metal powder having excellent conductivity, and a metal powder having higher affinity for oxygen than Sn, and then drying the coating. As the main component metal powder, powders of the various metals or alloys described in the first embodiment can be used. As the metal powder having higher affinity for oxygen than Sn, powders of the above-described metals such as Ti, Mo, W, V, and the like can be used.

The ratio of the weight of metal powder having higher affinity for oxygen than Sn to the main component metal powder is preferably about 0.1% to 20% by weight. The reason for this is the same as the first embodiment.

Figure 5B:
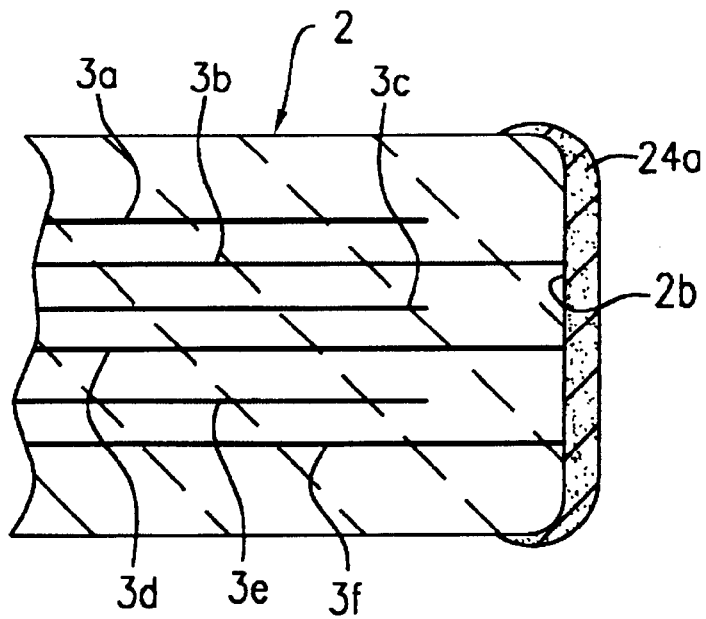

Next, the conductive paste layer 24 is sintered by heating to form the terminal electrode 24a shown in FIG. 5(b). Since, in the terminal electrode 24a, the metal having higher affinity for oxygen than Sn is present in the interface between the ceramic sintered compact 2 and the terminal electrode 24a, as in the first embodiment, breakage of the oxygen bond between the metal having higher affinity for oxygen than Sn and ceramic is reduced even when the Sn contained in solder is diffused. Therefore, as in the first embodiment, deterioration of the adhesive strength of the terminal electrode 24a, and electric characteristics are reduced.

The adhesive force between the terminal electrode formed by coating and baking the conductive paste and the ceramic sintered compact is determined by the bonding effect of glass frit in the interface between ceramic and the metal as well as the effect of the oxygen bonding. However, in order to maintain the electric characteristics for a long period of time, it is necessary to maintain the oxygen bonding. In this embodiment, since the oxygen bonding is maintained by the metal having higher affinity for oxygen than Sn, electric characteristics can securely be maintained even in long-term use.

As in the first embodiment, the metal present in the interface between the terminal electrode 24a and the ceramic sintered compact 2 is mostly the main component metal having excellent conductivity, and thus the terminal electrode 24a satisfies the requirements of low loss and low calorific value.

In forming the terminal electrode 24a by coating and baking conductive paste as in the third embodiment, when the sintering temperature of the main component metal is significantly different from the metal having higher affinity for oxygen than Sn, a conductive paste containing a powder of each of the metals may be formed so that conductive paste having a higher sintering temperature is first coated and sintered, and then conductive paste having a lower sintering temperature is coated and sintered. In this case, in the latter sintering site, both metals are diffused to each other to cause the presence of the main component metal and the metal having higher affinity for oxygen than Sn in the interface between the ceramic sintered compact and the terminal electrode.

In the third embodiment, an electrode layer having excellent soldering heat resistance and an electrode layer having excellent solderability may be laminated on the outside of the terminal electrode 24a.

Figure 6:
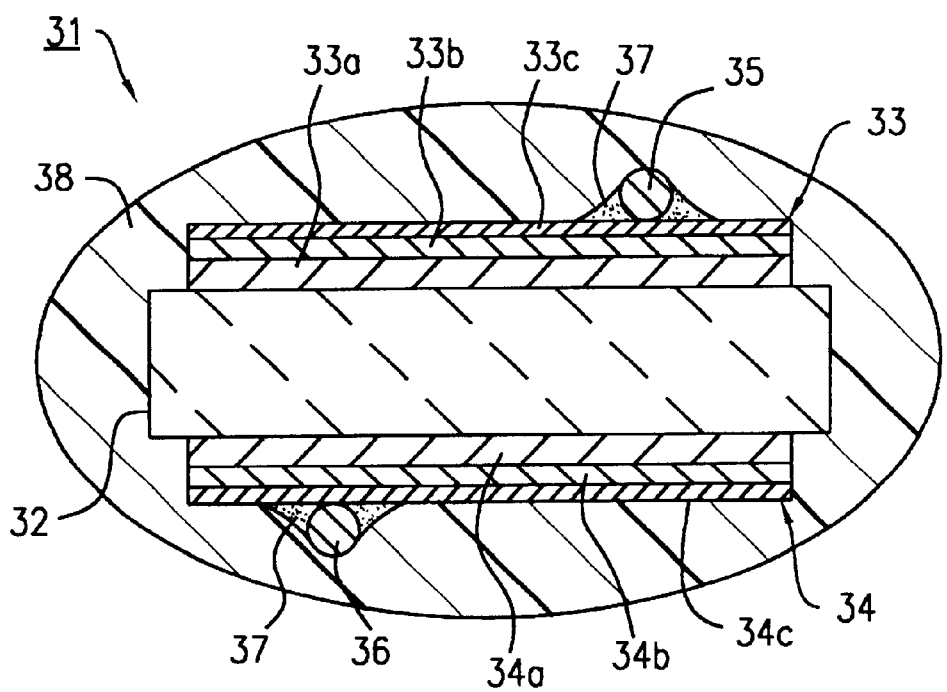
FIG. 6 is a sectional view illustrating a ceramic electronic part of another embodiment to which the present invention is applied.
Figure 7:
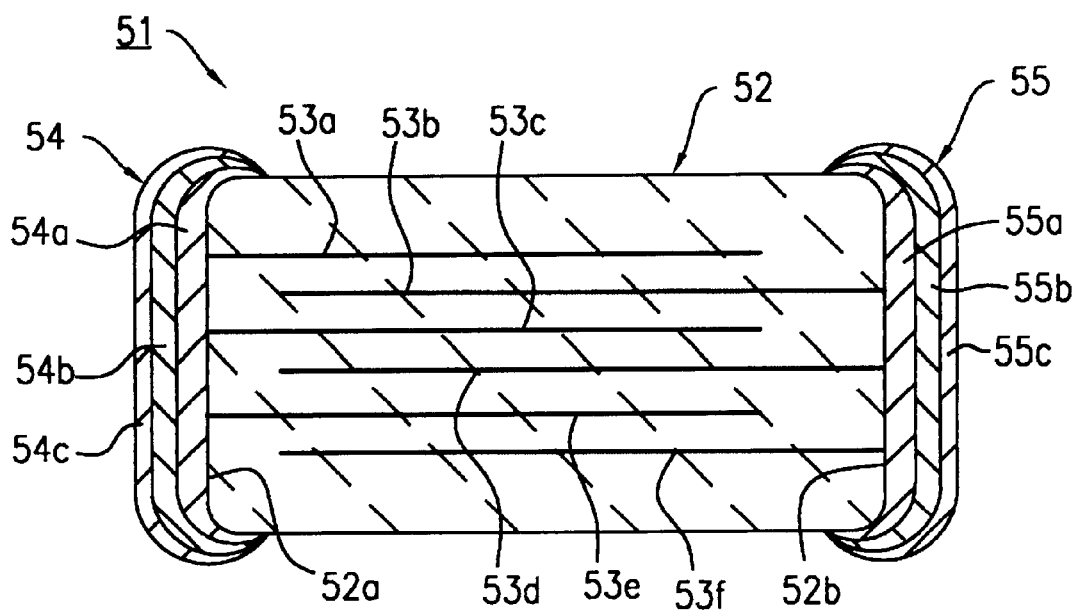
FIG. 7 is a longitudinal sectional view showing a conventional monolithic capacitor.

FIG. 6 is a sectional view illustrating a ceramic electronic part of another embodiment to which the present invention is applied. A ceramic electronic part of this embodiment is a single-chip ceramic capacitor.

A ceramic capacitor 31 comprises a plate-shaped ceramic element assembly 32 comprising dielectric ceramic such as barium titanate or the like. Terminal electrodes 33 and 34 are formed on opposite sides of the ceramic element assembly 42. The terminal electrodes 33 and 34 comprise first to third electrode layers 33a and 34a to 33c and 34c, respectively. The first to third electrode layers 33a and 34a to 33c to 34c have the same construction as the first to third electrode layers 4a and 5a to 4c and 5c of the first embodiment. Lead terminals 35 and 36 are bonded to the terminal electrodes 33 and 34, respectively, by solder 37. Reference numeral 38 denotes a sheath resin.

In this embodiment, in use at high temperature, even when Sn contained in the solder used for soldering the lead terminals 35 and 36 is diffused to the terminal electrodes 33 and 34, the metal having higher affinity for oxygen than Sn is present in the interfaces between the first electrode layers 33a and 34a and the ceramic element assembly 32, thereby reducing deterioration of the strength of adhesion of the terminal electrodes 33 and 34 to the ceramic element assembly 32. Therefore, as in the first embodiment, electric characteristics deteriorate less due to the diffusion of Sn.

In the present invention, it is possible to prevent deterioration in electric characteristics with deterioration in adhesion between the terminal electrodes and the ceramic sintered compact due to the diffusion of Sn contained in solder. Therefore, the present invention can be applied to ceramic electronic parts other than the monolithic capacitor 1 (e.g., a monolithic varistor, a monolithic inductor, a monolithic ceramic piezoelectric parts, etc., other various ceramic electronic parts such as a single-chip ceramic thermistor, etc.).

In a ceramic electronic part of the present invention, a portion of a terminal electrode which adheres closely to the surface of a ceramic element assembly, contains a metal having higher affinity for oxygen than Sn. Therefore, even when Sn contained in solder is diffused at high temperature, there is less damage to the oxygen bonding between the metal having higher affinity for oxygen than Sn and the ceramic material, and thus the adhesive strength of the terminal electrode deteriorates less, thereby providing a ceramic electronic part which can securely exhibit desired initial electric characteristics.

Therefore, a ceramic electronic part of the present invention can preferably be used for ceramic electronic parts in which Sn is readily diffused to the interface between the terminal electrode and the ceramic element assembly, for example, such as medium-to-high-voltage ceramic electronic parts in which heat is generated in practical use. In such medium-to-high-voltage ceramic electronic parts, deterioration in electric characteristics can be suppressed.

In the present invention, when the main component metal which constitutes the terminal electrode and the metal having higher affinity for oxygen than Sn are alloyed, the rate of alloying can be controlled so that the metal having higher affinity for oxygen than Sn is securely present at a desired ratio in the interface between the terminal electrode and the surface of the ceramic element assembly.

When the terminal electrode comprises a plurality of electrode layers, a layer which adheres to the ceramic element assembly is formed to contain the metal having higher affinity for oxygen than Sn, securely preventing deterioration in electric characteristics due to diffusion of Sn.

As the metal having higher affinity for oxygen than Sn, at least one metal selected from the group consisting of Ti, Mo, W and V can be used to effectively prevent deterioration in the adhesive strength of the terminal electrode, and by extension, deterioration in electric characteristics.

When the metal having higher affinity for oxygen than Sn is present at a ratio of 0.1% to 20% by weight of the main component metal in the face of adhesion between the terminal electrode and the ceramic element assembly, the presence of the metal having higher affinity for oxygen than Sn can securely prevent deterioration in electric characteristics, thereby exhibiting sufficient conductivity. For example, in use for medium-to-high-voltage application, a loss and calorific value of the terminal electrode can be decreased.

What is claimed is:

1. A ceramic electronic part comprising:
   a ceramic element assembly;
   a terminal electrode directly formed on an outer surface of the ceramic element assembly, a portion of the terminal electrode which closely and directly adheres to the surface of the ceramic element assembly includes both a main component metal which is the primary component of said portion of the terminal electrode and a metal having higher affinity for oxygen than Sn which is at least one metal selected from the group consisting of Ti, Mo and W; and
   a lead terminal soldered to the terminal electrode.

2. A ceramic electronic part according to claim 1, wherein the main component metal and the metal having higher affinity for oxygen than Sn are alloyed.

3. A ceramic electronic part according to claim 2, wherein the terminal electrode comprises a plurality of electrode layers, one of which closely adheres to the ceramic element assembly and contains the metal having higher affinity for oxygen than Sn.

4. A ceramic electronic part according to claim 1, wherein the terminal electrode comprises a plurality of electrode layers, one of which closely adheres to the ceramic element assembly and contains the metal having higher affinity for oxygen than Sn.

5. A ceramic electronic part according to claim 1, wherein the metal having higher affinity for oxygen than Sn is Ti.

6. A ceramic electronic part according to claim 1, wherein the metal having higher affinity for oxygen than Sn is Mo.

7. A ceramic electronic part according to claim 1, wherein the metal having higher affinity for oxygen than Sn is W.

8. A ceramic electronic part according to claim 1, wherein the metal having higher affinity for oxygen than Sn is present at a ratio of 0.1 to 20% by weight of the main component metal in said portion of the terminal electrode which adheres to the ceramic element assembly.

9. A ceramic electronic part according to claim 2, wherein the metal having higher affinity for oxygen than Sn is present at a ratio of 0.1 to 20% by weight of the main component metal in said portion of the terminal electrode which adheres to the ceramic element assembly.

10. A ceramic electronic part according to claim 3, wherein the metal having higher affinity for oxygen than Sn is present at a ratio of 0.1 to 20% by weight of the main component metal in said portion of the terminal electrode which adheres to the ceramic element assembly.

11. A ceramic electronic part according to claim 4, wherein the metal having higher affinity for oxygen than Sn is present at a ratio of 0.1 to 20% by weight of the main component metal in said portion of the terminal electrode which adheres to the ceramic element assembly.

12. A ceramic electronic part according to claim 5, wherein the metal having higher affinity for oxygen than Sn is present at a ratio of 0.1 to 20% by weight of the main component metal in said portion of the terminal electrode which adheres to the ceramic element assembly.

13. A ceramic electronic part according to claim 6, wherein the metal having higher affinity for oxygen than Sn is present at a ratio of 0.1 to 20% by weight of the main component metal in said portion of the terminal electrode which adheres to the ceramic element assembly.

14. A ceramic electronic part according to claim 7, wherein the metal having higher affinity for oxygen than Sn is present at a ratio of 0.1 to 20% by weight of the main component metal in said portion of the terminal electrode which adheres to the ceramic element assembly.

15. A ceramic electronic part according to claim 1, wherein the lead terminal is soldered to the terminal electrode by a lead solder.

16. A ceramic electronic part according to claim 1, wherein the metal having the higher affinity for oxygen then Sn is diffused in the main component metal.

17. A ceramic electronic part according to claim 16, wherein the lead terminal is soldered to the terminal electrode by a lead solder.

* * * * *